United States Patent
Chen et al.

(10) Patent No.: US 12,050,252 B2
(45) Date of Patent: Jul. 30, 2024

(54) STATE-OF-CHARGE CUT-OFF CONTROL METHOD, APPARATUS AND SYSTEM, AND STORAGE MEDIUM

(71) Applicant: CONTEMPORARY AMPEREX TECHNOLOGY CO., LIMITED, Ningde (CN)

(72) Inventors: Chen Chen, Ningde (CN); Guangyu Xu, Ningde (CN); Wei Zhao, Ningde (CN)

(73) Assignee: CONTEMPORARY AMPEREX TECHNOLOGY CO., LIMITED, Ningde (CN)

( * ) Notice: Subject to any disclaimer, the term of this patent is extended or adjusted under 35 U.S.C. 154(b) by 190 days.

(21) Appl. No.: 17/845,362

(22) Filed: Jun. 21, 2022

(65) Prior Publication Data

US 2022/0326308 A1    Oct. 13, 2022

Related U.S. Application Data

(63) Continuation of application No. PCT/CN2021/086405, filed on Apr. 12, 2021.

(51) Int. Cl.
| | |
|---|---|
| *G01R 31/387* | (2019.01) |
| *G01R 31/36* | (2020.01) |
| *G01R 31/3842* | (2019.01) |
| *G01R 31/392* | (2019.01) |

(52) U.S. Cl.
CPC ....... *G01R 31/387* (2019.01); *G01R 31/3648* (2013.01); *G01R 31/3842* (2019.01); *G01R 31/392* (2019.01)

(58) Field of Classification Search
CPC ............... G01R 31/387; G01R 31/392; G01R 31/3842; G01R 31/3648

USPC .......................................... 320/132
See application file for complete search history.

(56) References Cited

U.S. PATENT DOCUMENTS

| | | | |
|---|---|---|---|
| 6,114,836 A * | 9/2000 | Hagiwara | H02J 7/007182 320/132 |
| 10,732,225 B2 | 8/2020 | Yun et al. | |
| 2012/0161715 A1* | 6/2012 | Park | H02J 7/0016 320/136 |

(Continued)

FOREIGN PATENT DOCUMENTS

| | | |
|---|---|---|
| CN | 103267953 A | 8/2013 |
| CN | 106329021 A | 1/2017 |
| CN | 107356874 A | 11/2017 |

OTHER PUBLICATIONS

International Search Report of Application No. PCT/CN2021/086405, mailed Jan. 6, 2022.

(Continued)

*Primary Examiner* — Nathaniel R Pelton
(74) *Attorney, Agent, or Firm* — Ladas & Parry LLP

(57) ABSTRACT

Embodiments of this application relate to the technical field of batteries, and in particular, to a state-of-charge cut-off control method, apparatus and system, and a storage medium. The method includes: obtaining, in a discharging process of a battery, a net discharge capacity of a first battery cell from being fully charged to current time; obtaining an available capacity and a state of health of the first battery cell; obtaining a current remaining dischargeable capacity of the first battery cell; and setting a state of charge SOC of the first battery cell to 0.

12 Claims, 5 Drawing Sheets

(56) References Cited

U.S. PATENT DOCUMENTS

2018/0106867 A1\* 4/2018 Yun .................... G01R 31/3647
2020/0319257 A1 10/2020 Yun et al.

OTHER PUBLICATIONS

Written Opinion of Application No. PCT/CN2021/086405, mailed Jan. 6, 2022.
Extended European Search Report for EP application No. 21908068.6, mailed Mar. 17, 2023.

\* cited by examiner

STATE-OF-CHARGE CUT-OFF CONTROL METHOD, APPARATUS AND SYSTEM, AND STORAGE MEDIUM

CROSS-REFERENCE TO RELATED APPLICATION

This application is a continuation of International Patent Application No. PCT/CN2021/086405, filed on Apr. 12, 2021, which is incorporated herein by reference in its entirety.

TECHNICAL FIELD

Embodiments of this application relate to the technical field of batteries, and in particular, to a state-of-charge cut-off control method, apparatus and system, and a storage medium.

BACKGROUND

In research of batteries, the research of battery management system (BMS) is gradually becoming a new hot spot, in which accurate estimation of a state of charge (SOC) of a battery is rather difficult. In existing technical solutions, commonly used SOC estimation methods include an open-circuit voltage (OCV) method and an Ampere-hour integral method. In the open-circuit voltage method, based on an OCV-SOC curve of a battery, a SOC of the battery is obtained according to a current OCV of the battery, and therefore a remaining capacity of the battery can be accurately obtained. In the Ampere-hour integral method, a SOC is calculated based on an Ampere-hour integral, and therefore a remaining capacity of the battery can be accurately calculated.

However, the foregoing methods can only be used in a case that battery cells in the battery are of a same type. In this case, capacity, charging/discharging patterns, and aging patterns of the battery cells are only slightly different, such that the capacity, charging/discharging pattern, and aging pattern of the battery are substantially consistent with parameter changing patterns of each individual battery cell. Therefore, the SOC of the battery estimated by the BMS based on capacity changing patterns of individual battery cells has a small error.

However, in an actual manufacturing process, it is possible that at least two different types of battery cells are included in a battery. Parameters such as capacities, charging/discharging patterns, and aging patterns of different types of battery cells are largely different. Therefore, using a conventional battery SOC estimation method to estimate the SOC of such battery is apparently inviting a larger error. Especially when the SOC approaches 0, if SOC estimation is inaccurate, an electric apparatus may shut down halfway, and planned workload cannot be completed as expected by a user.

SUMMARY

In view of the foregoing problem, embodiments of this application provide a state-of-charge cut-off control method, apparatus and system, and a storage medium, to accurately estimate a state of charge SOC of a battery including at least two different types of battery cells, thereby reducing a probability that an electric apparatus shuts down halfway due to a remaining dischargeable capacity of 0 before the SOC becomes 0.

According to a first aspect of an embodiment of this application, a state-of-charge cut-off control method is provided. The method includes: obtaining, in a discharging process of a battery, a net discharge capacity of a first battery cell from being fully charged to current time, where the battery includes at least a first-type battery cell and a second-type battery cell, the first-type battery cell and the second-type battery cell are battery cells with different positive electrode materials, and the first battery cell is any one of the first-type battery cell or the second-type battery cell;

obtaining an available capacity of the first battery cell and a state of health SOH of the first battery cell;

obtaining a current remaining dischargeable capacity of the first battery cell, based on a nominal capacity of the battery, the net discharge capacity of the first battery cell, the available capacity of the first battery cell, and the SOH of the first battery cell; and setting a state of charge SOC of the first battery cell to 0 when a sum of the current remaining dischargeable capacity of the first battery cell and the net discharge capacity of the first battery cell is greater than or equal to the nominal capacity of the battery and the net discharge capacity of the first battery cell is equal to the nominal capacity of the battery.

In the foregoing solution, the nominal capacity of the battery has been set to a fixed value before the battery leaves factory; and the sum of the current remaining dischargeable capacity of the first battery cell and the net discharge capacity of the first battery is a variable, is determined by the positive electrode material of the first battery cell, and is also affected by factors such as the temperature and state of health of the first battery cell. When the sum of the current remaining dischargeable capacity of the first battery cell and the net discharge capacity of the first battery cell is greater than or equal to the nominal capacity of the battery, an open-circuit voltage of the first battery cell is relatively high. If an open-circuit voltage method is used, a SOC of the first battery cell obtained by table look-up is relatively high. However, in practice, it is not always the case that a sum of a current remaining dischargeable capacity and a net discharge capacity of each type of battery cell in the battery is greater than or equal to the nominal capacity of the battery. Therefore, if the SOC of the battery is obtained based on the SOC of the first battery cell, the SOC of the battery is greater than an actual remaining dischargeable capacity of the battery. As a result, the remaining dischargeable capacity of the battery may have become 0 before the displayed SOC of the battery reaches 0, causing an electric apparatus to shut down halfway. In this embodiment of this application, a cut-off time of the SOC of the first battery cell is set based on the net discharge capacity, so that when the first battery cell releases the nominal capacity, the SOC of the first battery cell is displayed as 0, and in this case, the remaining dischargeable capacity of the first battery cell is greater than or equal to 0. The SOC of the battery is obtained based on the SOC of the first battery cell. Therefore, when the SOC of the battery is 0, the remaining dischargeable capacity of the battery is greater than or equal to 0, reducing a probability that an electric apparatus shuts down halfway before the displayed SOC of the battery becomes 0.

In some embodiments, the state-of-charge cut-off control method further includes: setting the SOC of the first battery cell to $S_1$ when the sum of the current remaining dischargeable capacity of the first battery cell and the net discharge capacity of the first battery cell is less than the nominal capacity and the SOC of the first battery cell is less than the cut-off capacity $S_1$, where $S_1$ is greater than 0.

In the foregoing solution, when the sum of the current remaining dischargeable capacity of the first battery cell and the net discharge capacity of the first battery cell is less than the nominal capacity, the SOC of the first battery cell calculated by using an Ampere-hour integral method is smaller. However, in practice, it is not always the case that a sum of a current remaining dischargeable capacity and a net discharge capacity of each type of battery cell in the battery is less than the nominal capacity. Therefore, if the SOC of the battery is obtained based on the SOC of the first battery cell, the SOC value of the battery is less than the actual remaining dischargeable capacity of the battery, and has an increasingly large error as discharge time accumulates. As a result, the remaining dischargeable capacity of the battery is far greater than 0 when the displayed SOC of the battery already reaches 0, causing incomplete release of the available capacity of the battery, waste of capacity, and users' doubt about the capacity of the battery. In this embodiment of this application, the SOC of the first battery cell is set to a fixed value in a period of time before it drops to 0. In this case, the remaining dischargeable capacity of the first battery cell decreases along with a discharging process, and a difference between the remaining dischargeable capacity and the SOC of the first battery cell gradually decreases, so that an error of the estimated SOC of the first battery cell decreases, and an error of the SOC of the battery estimated based on the SOC of the first battery cell also decreases. When the SOC of the battery is 0, the available capacity of the battery can be released as much as possible, improving user satisfaction.

In some embodiments, the state-of-charge cut-off control method further includes: setting the SOC of the first battery cell to 0 when the sum of the current remaining dischargeable capacity of the first battery cell and the net discharge capacity of the first battery cell is less than the nominal capacity, a voltage of the first battery cell is less than a cut-off voltage $V_1$, and a current of the first battery cell is less than a cut-off current $A_1$.

In the foregoing solution, values of $V_1$ and $A_1$ may be preset on a BMS. When the voltage of the first battery cell is less than the cut-off voltage $V_1$ and the current of the first battery cell is less than the cut-off current $A_1$, the SOC of the first battery cell is changed from $S_1$ to 0, to reduce an estimation error of the SOC of the first battery cell, thereby reducing an error of the SOC of the battery estimated based on the SOC of the first battery cell, and ensuring that the available capacity of the battery can be released completely as possible when the SOC of the battery is 0.

In some embodiments, the current remaining dischargeable capacity of the first battery cell is obtained according to the following equation:

$$C_1=C_0 \times SOH-(C_0-C_T)-C_2,$$

where $C_1$ represents the current remaining dischargeable capacity of the first battery cell;

$C_0$ represents the nominal capacity of the battery;

$C_T$ represents an available capacity of the first battery cell at a current temperature;

$C_2$ represents the net discharge capacity of the first battery cell; and

SOH represents the current state of heath SOH of the first battery cell, ranging from 0% to 100%.

In the foregoing solution, the current remaining dischargeable capacity of the first battery cell is associated with the current temperature and current state of health of the first battery cell, and the calculated current remaining dischargeable capacity of the first battery cell has a small error, achieving high data accuracy.

In some embodiments, the nominal capacity of the battery is less than or equal to an initial available capacity of a second battery cell, where the second battery cell is a battery cell with a minimum initial available capacity in the battery.

In the foregoing solution, a user learns about the capacity of the battery based on the nominal capacity of the battery. Therefore, setting the nominal capacity ensures that the battery can reach the nominal capacity at least during initial use.

In some embodiments, the obtaining the net discharge capacity of the first battery cell from being fully charged to current time further includes:

determining whether there is a case that a voltage of a third battery cell is less than a tail end voltage $V_2$, that a current of the third battery cell is less than a tail end current $A_2$, and that a SOC of the third battery cell is less than a tail end capacity $S_2$, and if there is such a case, obtaining the net discharge capacity of the first battery cell from being fully charged to current time, where the third battery cell is any one of the first-type battery cell or the second-type battery cell.

In the foregoing solution, determining is performed based on the tail end voltage $V_2$, the tail end current $A_2$, and the tail end capacity Sz, to ensure that determining whether to set the SOC of the first battery cell to 0 is performed only when the SOC of the battery truly approaches 0, thereby reducing determining times of the BMS.

In some embodiments, a state of charge $SOC_{total}$ of the battery is determined according to the following equation:

$$SOC_{total}=SOC_{min}/(1-SOC_{max}+SOC_{min}) \times 100\%,$$

where $SOC_{total}$ represents the state of charge of the battery;

$SOC_{min}$ represents a state of charge of a minimum-power battery cell in the battery; and $SOC_{max}$ represents a state of charge of a maximum-power battery cell in the battery.

In the foregoing solution, the state of charge of each battery cell in the battery is relatively precise, and therefore the state of charge $SOC_{total}$ of the battery calculated based on the state of charge of the battery cell is also relatively precise.

According to a second aspect of an embodiment of this application, a state-of-charge cut-off control apparatus is provided, including:

a processing unit, configured to: obtain a net discharge capacity of a first battery cell from being fully charged to current time, where a battery includes at least a first-type battery cell and a second-type battery cell, the first-type battery cell and the second-type battery cell are battery cells with different capacities, and the first battery cell is any one of the first-type battery cell or the second-type battery cell;

obtain an available capacity of the first battery cell and a state of health SOH of the first battery cell; and obtain a current remaining dischargeable capacity of the first battery cell, based on a nominal capacity of the battery, the net discharge capacity of the first battery cell, the available capacity of the first battery cell, and the SOH of the first battery cell; and a setting unit, configured to set a state of charge SOC of the first battery cell to 0 when a sum of the current remaining dischargeable capacity of the first battery cell and the net discharge capacity of the first battery cell is greater than or equal to the nominal capacity of the battery and the net discharge capacity of the first battery cell is equal to the nominal capacity of the battery.

In some embodiments, the setting unit is further configured to: set the SOC of the first battery cell to $S_1$ when the sum of the current remaining dischargeable capacity of the first battery cell and the net discharge capacity of the first battery cell is less than the nominal capacity and the state of charge SOC of the first battery cell is less than the cut-off capacity $S_1$, where the $S_1$ is greater than 0.

In some embodiments, the processing unit is further configured to obtain the current remaining dischargeable capacity of the first battery cell according to the following equation:

$$C_1=C_0 \times SOH-(C_0-C_T)-C_2,$$

where $C_1$ represents the current remaining dischargeable capacity of the first battery cell;

$C_0$ represents the nominal capacity of the battery;

$C_T$ represents an available capacity of the first battery cell at a current temperature;

$C_2$ represents the net discharge capacity of the first battery cell; and

SOH represents the current state of heath of the first battery cell, ranging from 0% to 100%.

In some embodiments, the nominal capacity of the battery is less than or equal to an initial available capacity of a second battery cell, where the second battery cell is a battery cell with a minimum initial available capacity in the battery.

In some embodiments, the obtaining, by the processing unit, the net discharge capacity of the first battery cell from being fully charged to current time includes: determining, by the processing unit, whether there is a case that a voltage of a third battery cell is less than a tail end voltage $V_2$, that a current of the third battery cell is less than a tail end current $A_2$, and that a SOC of the third battery cell is less than a tail end capacity $S_2$, and if there is such a case, obtaining the net discharge capacity of the first battery cell from being fully charged to current time, where the third battery cell is any one of the first-type battery cell or the second-type battery cell.

In some embodiments, the processing unit determines a state of charge $SOC_{total}$ of the battery according to the following equation:

$$SOC_{total}=SOC_{min}/(1-SOC_{max}+SOC_{min}) \times 100\%,$$

where $SOC_{total}$ represents the state of charge of the battery;

$SOC_{min}$ represents a state of charge of a minimum-power battery cell in the battery; and $SOC_{max}$ represents a state of charge of a maximum-power battery cell in the battery.

According to a third aspect of an embodiment of this application, a state-of-charge cut-off control system is provided. The system includes: a processor, a memory, and a bus, where the memory and the processor communicate with each other through the bus; and the memory is configured to store executable program code; and the processor is configured to read the executable program code stored in the memory, to implement the state-of-charge cut-off control method according to the foregoing embodiment.

According to a fourth aspect of an embodiment of this application, a computer-readable storage medium is provided, where the computer-readable storage medium stores a computer program, and when the computer program runs on a computer, the computer executes the state-of-charge cut-off control method according to the foregoing embodiment.

In the embodiments of this application, any first battery cell in the battery with two types of battery cells is determined, and the state of charge SOC of the first battery cell is set to 0 when the sum of the current remaining dischargeable capacity of the first battery cell and the net discharge capacity of the first battery cell is greater than or equal to the nominal capacity of the battery and the net discharge capacity of the first battery cell is equal to the nominal capacity of the battery, so that when the first battery cell releases the nominal capacity, the SOC of the first battery cell is displayed as 0. In this case, the remaining dischargeable capacity of the first battery cell is greater than or equal to 0. The SOC of the battery is obtained based on the SOC of the first battery cell. Therefore, when the SOC of the battery is 0, the remaining dischargeable capacity of the battery is greater than or equal to 0, reducing a probability that an electric apparatus shuts down halfway before the displayed SOC of the battery becomes 0.

The foregoing descriptions are merely the general descriptions of the technical solutions of the embodiments of this application. For clearer understanding, the technical means of the embodiments of this application can be implemented according to content of this specification. To make the foregoing and other objectives, features and advantages of the embodiments of this application clearer, the following particularly lists the specific implementations of this application.

BRIEF DESCRIPTION OF DRAWINGS

To describe the technical solutions in the embodiments of this application more clearly, the following briefly describes the accompanying drawings required for describing the embodiments. Apparently, the accompanying drawings in the following descriptions show some embodiments of this application, and a person of ordinary skill in the art may still derive others drawings from these accompanying drawings without creative efforts.

DETAILED DESCRIPTION

Figure 1:
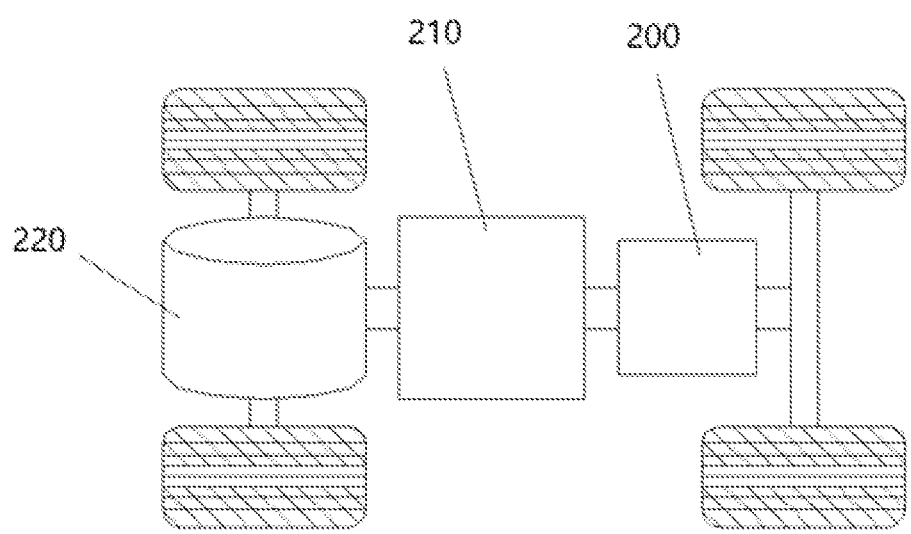
FIG. 1 is a schematic structural diagram of an electric apparatus according to an embodiment of this application.

To make the objectives, technical solutions, and advantages of the embodiments of this application clearer, the following clearly describes the technical solutions in the embodiments of this application with reference to the accompanying drawings in the embodiments of this application. Apparently, the embodiments described are some rather than all of the embodiments of this application. All other embodiments obtained by a person of ordinary skill in the art based on the embodiments of this application without creative efforts shall fall within the protection scope of this application.

Unless otherwise defined, all technical and scientific terms used herein shall have the same meanings as commonly understood by those skilled in the art to which this application belongs. The terms used in the specification of this application are merely intended to describe the specific embodiments but not intended to constitute any limitation on this application.

The terms "including" and "having" and any other variations thereof in the specification, the claims and the brief description of drawings of this application are intended to cover but not exclude other content. The word "a" or "an" does not exclude the presence of plurality.

The term "embodiment" described herein means that specific features, structures or characteristics in combination with descriptions of the embodiments may be incorporated in at least one embodiment of this application. The word "embodiment" in various positions in the specification does not necessarily refer to a same embodiment, or an independent or alternative embodiment that is exclusive of other embodiments. Persons skilled in the art explicitly and implicitly understand that the embodiments described herein may combine with other embodiments.

The term "and/or" in this specification is only an associative relationship for describing associated objects, indicating that three relationships may exist. For example, A and/or B may indicate three scenarios: A alone; A and B; and B alone. In addition, a character "/" in this specification generally indicates an "or" relationship between contextually associated objects.

In addition, the terms "first", "second" and the like in the specification and the claims or the above accompanying drawings of this application are used to distinguish between different objects but not describe a specific sequence, and can explicitly or implicitly include one or more features.

In the descriptions of this application, unless otherwise specified, "plurality" means more than two (including two). Likewise, "multiple groups" means more than two groups (including two groups).

In the descriptions of this application, it should be noted that, unless otherwise specified and defined explicitly, the terms "installed", "connected" and "connection" should be understood broadly. For example, "connected" or "connection" of a mechanical structure may indicate physical connection. For example, the physical connection may be fixed connection, for example, fixed connection by using a fixing member such as a screw, a bolt or other fixing members; or the physical connection may be detachable connection, for example, connection by mutual clamping or clamping; or the physical connection may be an integral connection, for example, connection by welding, bonding or integral forming. "Connected" or "connection" of a circuit structure may indicate physical connection, and may also indicate electrical connection or signal connection, for example, may be direct connection, that is, the physical connection, may be indirect connection by using at least one element in between as long as circuit communication is implemented, and may also be communication between two elements; and the signal connection may be signal connection by using a circuit, and may also be signal connection by using a media medium, such as a radio wave. A person of ordinary skill in the art may understand specific meanings of the preceding terms in this application based on a specific situation.

An embodiment of this application provides a state-of-charge cut-off control method. The method is applicable to a battery including at least two types of battery cells. The battery may be a battery pack, a battery module, a battery group, or the like, which are collectively referred to as a battery in this application for ease of description. In addition, the battery in this embodiment of this application includes a battery management system (Battery Management System, BMS). Specifically, the method in this embodiment of this application may be applied to the BMS. Certainly, in this embodiment of this application, the BMS may be a standalone apparatus or device. The BMS may control the battery or the battery cells to set a state of charge of the battery or the battery cells according to the state-of-charge cut-off control method in this embodiment of this application.

For example, the battery includes two types of battery cells. The two types of battery cells may be named as a first-type battery cell and a second-type battery cell respectively, where the first-type battery cell and the second-type battery cell are battery cells with different positive electrode materials. For example, the first-type battery cell and the second-type battery cell may be two different types of a lithium-ion battery, a lithium-sulfur battery, a sodium-lithium-ion battery, a sodium-ion battery, a magnesium-ion battery, or the like. Alternatively, when the first-type battery cell and the second-type battery cell are a same type of a lithium-ion battery, a lithium-sulfur battery, a sodium-lithium-ion battery, a sodium-ion battery, a magnesium-ion battery, or the like, the specific positive electrode materials of the battery cells may be different. For example, when the first-type battery cell and the second-type battery cell are both lithium-ion batteries, the specific positive electrode materials of the battery cells may be two different types of lithium iron phosphate, lithium manganate oxide, lithium cobalt oxide, a ternary material, or the like.

The positive electrode materials of the first-type battery cell and the second-type battery cell are different, so capacity attenuation patterns, aging patterns, charging and discharging performance, and the like of the battery cells are all different. Therefore, even if initial available capacities of the two types of battery cells are the same, in the use process, the available capacities of the two types of battery cells are gradually becoming different. In addition, to meet a requirement on use performance of the battery, the initial available capacities of the first-type battery cell and the second-type battery cell are set different. For example, to prevent a type of rapidly-aging battery cell from affecting an overall capacity of the battery, an initial capacity of such battery cell is greater than a nominal capacity of the battery. The BMS limits a capacity use range of such battery cell before the battery cell ages, and gradually lifts the use range limit with the aging of the battery cell.

Therefore, the state of charge of such battery estimated by using a SOC estimation method in the existing technical solutions apparently has a large error. Especially when the SOC approaches 0, if SOC estimation is inaccurate, an electric apparatus may be unable to complete an estimation task as expected by a user.

For example, as shown in FIG. 1, the electric apparatus is a vehicle 2. The vehicle 2 includes a battery 200, a controller 210, and a motor 220. The battery 200 is configured to supply power to the controller 210 and the motor 220 as an operational power supply and a driving power supply of the vehicle 2. For example, the battery 200 is configured to supply power to meet the start, navigation, and operation requirements of the vehicle 2. The battery 200 supplies power to the controller 210. The controller 210 controls the battery 200 to supply power to the motor 220. The motor 220 receives and uses the power of the battery 200 as the driving power supply of the vehicle 2, to replace or partially replace fuel oil or natural gas to provide driving power to the vehicle 2.

At any time during usage of the vehicle 2, an actual available capacity of any one of a plurality of battery cells in the battery 200 may be greater than a nominal capacity of the battery 200, equal to the nominal capacity of the battery 200, or less than the nominal capacity of the battery 200. The actual available capacity means an available capacity of a battery cell based on material, current temperature, state of health, and other factors.

When an actual available capacity of a battery cell in the battery 200 is greater than the nominal capacity of the battery 200, if a SOC of the battery cell is corrected by using an open-circuit voltage (Open Circuit Voltage, OCV) of the battery cell and a SOC of the battery is obtained based on the SOC of the battery cell, the SOC of the battery is greater than a remaining dischargeable capacity of the battery. As a result, the actual remaining dischargeable capacity of the battery has become 0 before the SOC of the battery 200 reaches 0. For example, if a committed nominal capacity of the battery 200 leaving factory is 100 Ah, in the use process, a battery cell has a capacity of 110 Ah, and the battery discharges 100 Ah after being fully charged (power of the battery 200 reaches 100%). In this case, an actual remaining dischargeable capacity of the battery 200 should be 0. However, if an OCV-SOC curve is looked up based on the battery cell with a capacity of 110 Ah, a SOC of the battery cell is (110 Ah−100 Ah)/110 Ah×100%=9%, and apparently, a SOC of the battery 200 obtained based on the SOC of the battery cell is not 0, which is inconsistent with the actual remaining dischargeable capacity of the battery 200, causing an electric apparatus to shut down halfway, for example, causing the vehicle 2 to break down halfway.

On the contrary, when an actual available capacity of a battery cell in the battery 200 is less than the nominal capacity of the battery 200, if a SOC of the battery cell is calculated by using an Ampere-hour integral method and a SOC of the battery 200 is obtained based on the SOC of the battery cell, the obtained SOC of the battery 200 is less than an actual remaining dischargeable capacity of the battery 200, and has an increasingly large error relative to the remaining dischargeable capacity of the battery 200 over time. As a result, the remaining dischargeable capacity of the battery 200 is far greater than 0 when the SOC of the battery 200 already reaches 0, causing incomplete release of an available capacity of the battery 200, waste of capacity, and user's doubt about the capacity of the battery 200 due to failure to accurately estimate an available mileage of the vehicle 2 based on the nominal capacity.

Figure 2:
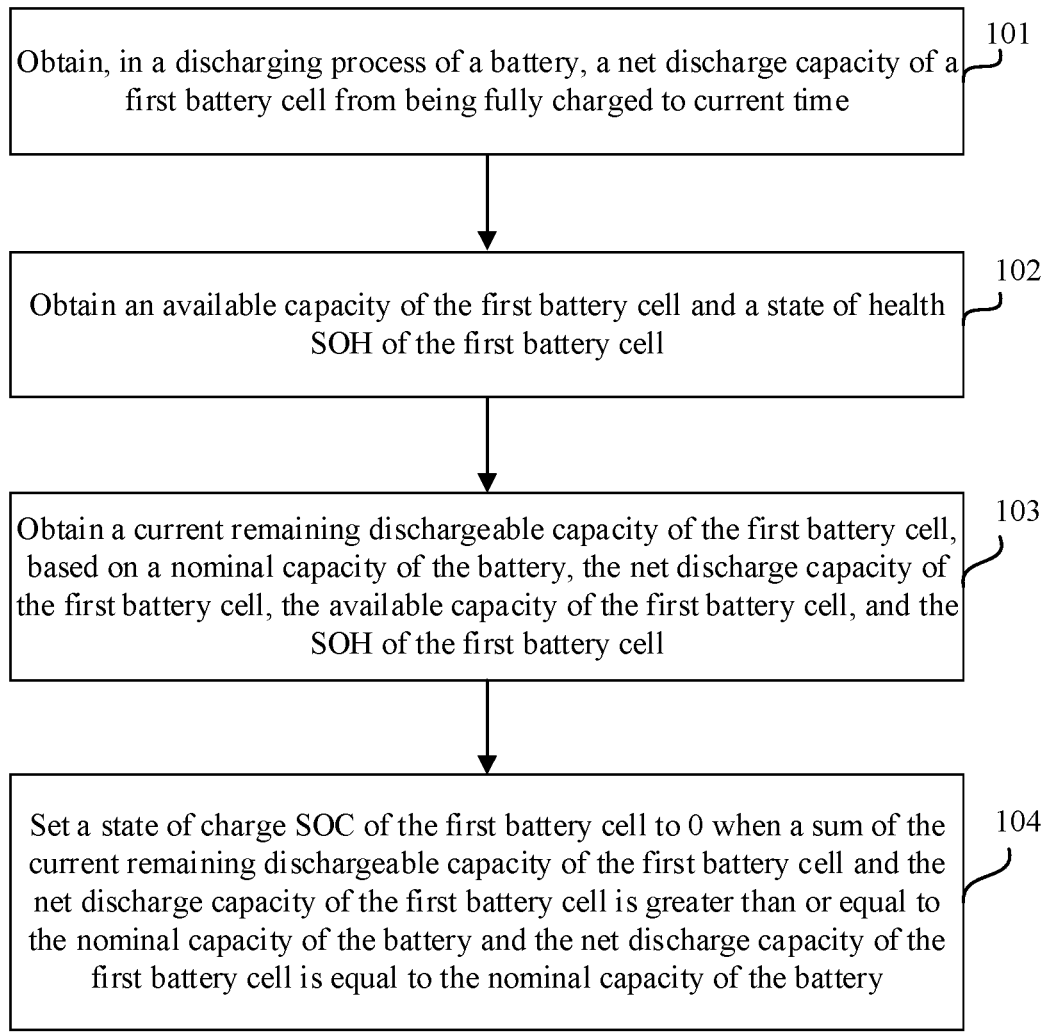
FIG. 2 is a flowchart of a state-of-charge cut-off control method according to an embodiment of this application.

In this case, as shown in FIG. 2, a state-of-charge cut-off control method according to an embodiment of this application includes the following steps.

Step 101: Obtain, in a discharging process of a battery, a net discharge capacity of a first battery cell from being fully charged to current time.

The first battery cell is any one of the first-type battery cell or the second-type battery cell. Being fully charged means a state in which a state of charge of the first battery cell is 100%. Certainly, being fully charge may alternatively refer to a case that a state of charge of the first battery cell is another numerical value. This is not limited in this application. The current time indicates a moment at which the net discharge capacity is obtained.

Step 102: Obtain an available capacity of the first battery cell and a state of health SOH of the first battery cell.

The available capacity is an available capacity of the first battery cell at a current temperature. The state of health SOH is also referred to as an aging degree, and ranges from 0% to 100%. As the charging and discharging times of the first battery cell increase, the SOH of the first battery cell decreases.

Step 103: Obtain a current remaining dischargeable capacity of the first battery cell, based on a nominal capacity of the battery, the net discharge capacity of the first battery cell, the available capacity of the first battery cell, and the SOH of the first battery cell.

The nominal capacity of the battery has been set to a fixed value before the battery leaves factory. For example, in some embodiments, the nominal capacity of the battery is less than or equal to an initial available capacity of a second battery cell. The second battery cell is defined as a battery cell with a minimum initial available capacity in the battery. The second battery cell and the first battery cell may be the same or different. The nominal capacity value may be directly stored in a BMS for use.

Step 104: Set a state of charge SOC of the first battery cell to 0 when a sum of the current remaining dischargeable capacity of the first battery cell and the net discharge capacity of the first battery cell is greater than or equal to the nominal capacity of the battery and the net discharge capacity of the first battery cell is equal to the nominal capacity of the battery.

In the solution of the foregoing embodiment of this application, a cut-off moment of the SOC of the first battery cell is set based on the net discharge capacity, so that when the first battery cell releases the nominal capacity, the SOC of the first battery cell is displayed as 0. In this case, the remaining dischargeable capacity of the first battery cell is greater than or equal to 0. The SOC of the battery is obtained based on the SOC of the first battery cell. Therefore, when the SOC of the battery is 0, the remaining dischargeable capacity of the battery is greater than or equal to 0, reducing a probability that an electric apparatus shuts down halfway before the SOC of the battery becomes 0.

The technical solution in this embodiment of this application resolves the problem in the related art: when the SOC of the first battery cell is estimated by using an open-circuit voltage method and the SOC of the battery is obtained based on the SOC of the first battery cell, the SOC of the battery is greater than an actual remaining dischargeable capacity of the battery, so that the remaining dischargeable capacity of the battery has become 0 before the displayed SOC of the battery reaches 0, causing an electric apparatus to shut down halfway.

Moreover, in addition to that the sum of the current remaining dischargeable capacity of the first battery cell and the net discharge capacity of the first battery cell is greater than or equal to the nominal capacity of the battery, the sum of the current remaining dischargeable capacity of the first battery cell and the net discharge capacity of the first battery cell may be less than the nominal capacity in the battery. For example, the capacity of the first battery cell fades as the charging and discharging times increase. In this case, if the BMS calculates the SOC of the first battery cell by using an Ampere-hour integral method, the obtained SOC of the first battery cell is relatively small. If the BMS still obtains the SOC of the battery based on the SOC of the first battery cell, the SOC value of the battery is less than the actual remaining dischargeable capacity of the battery, and has an increasingly large error as the discharging time accumulates. As a result, the remaining dischargeable capacity of the battery is far greater than 0 when the displayed SOC of the battery already reaches 0, causing incomplete release of the available capacity of the battery, waste of capacity, and users' doubt about the capacity of the battery.

Figure 3:
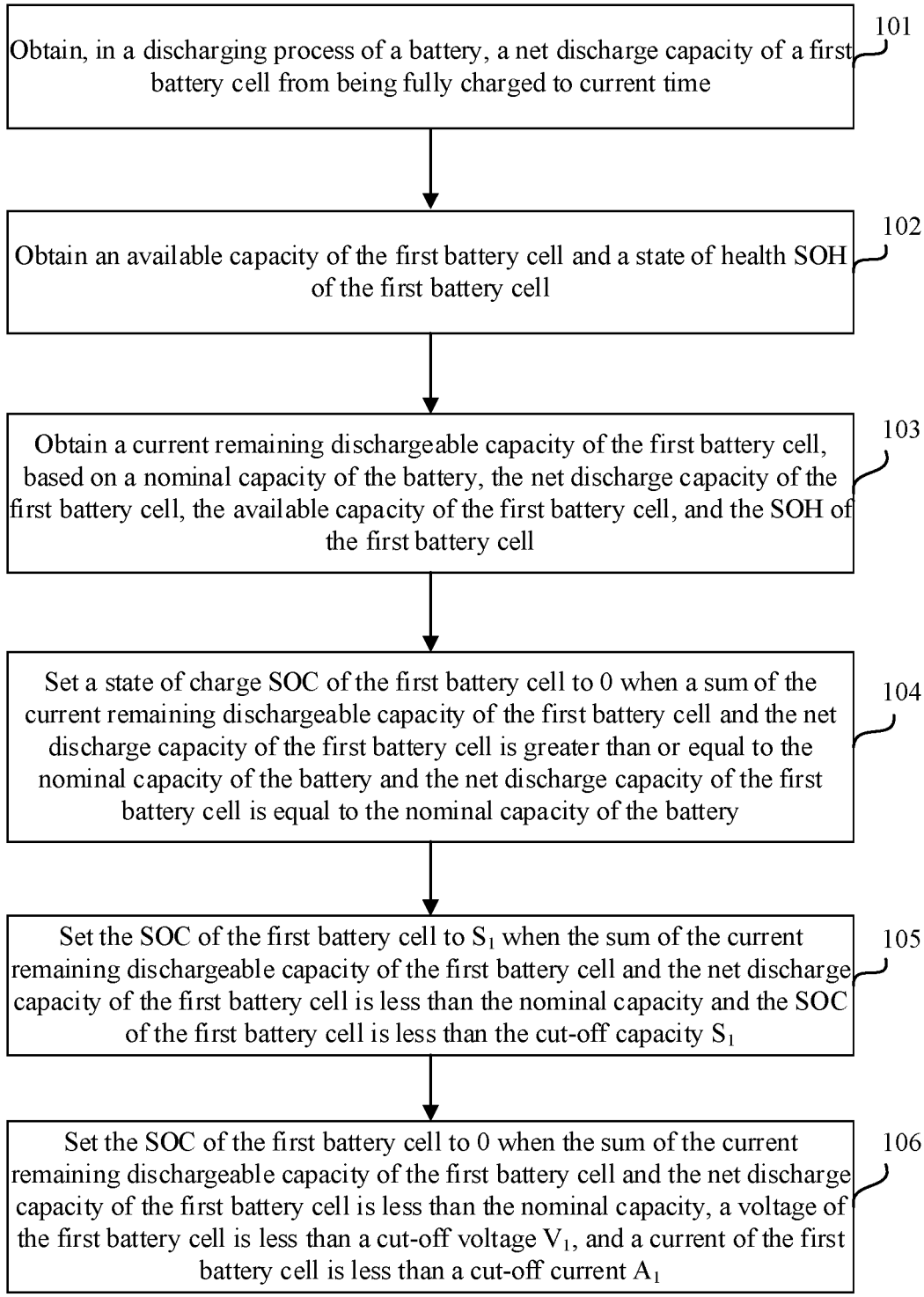
FIG. 3 is a flowchart of another state-of-charge cut-off control method according to an embodiment of this application.

Optionally, as shown in FIG. 3, in some embodiments, the state-of-charge cut-off control method further includes the following step.

Step 105: Set the SOC of the first battery cell to $S_1$ when the sum of the current remaining dischargeable capacity of the first battery cell and the net discharge capacity of the first battery cell is less than the nominal capacity and the SOC of the first battery cell is less than the cut-off capacity $S_1$.

$S_1$ is a preset value greater than 0. For example, $S_1$ is set to 2%, and stored in the BMS for direct use. When the SOC of the first battery cell is less than 2%, the SOC of the first battery cell is set to be 2%.

Optionally, in some embodiments, the state-of-charge cut-off control method further includes the following step.

Step 106: Set the SOC of the first battery cell to 0 when the sum of the current remaining dischargeable capacity of the first battery cell and the net discharge capacity of the first battery cell is less than the nominal capacity and a voltage of the first battery cell is less than a cut-off voltage $V_1$ and a current of the first battery cell is less than a cut-off current $A_1$.

Values of $V_1$ and $A_1$ may be preset on the BMS. For example, the value of $V_1$ is a voltage value when a remaining dischargeable capacity of a battery cell with an actual available capacity equal to the nominal capacity in the battery is equal to 0, and the value of $A_1$ is a current value when a remaining dischargeable capacity of a battery cell with an actual available capacity equal to the nominal capacity in the battery is equal to 0.

In the solution of the foregoing embodiment of this application, the SOC of the first battery cell is set to a fixed value $S_1$ in a period of time before it becomes 0. In this case, the remaining dischargeable capacity of the first battery cell decreases along with a discharging process, and therefore a difference between the remaining dischargeable capacity and the SOC of the first battery cell gradually decreases.

When the voltage of the first battery cell is less than the cut-off voltage $V_1$ and the current of the first battery cell is less than the cut-off current $A_1$, the SOC of the first battery cell is changed from $S_1$ to 0. This improves cut-off accuracy of the SOC of the first battery cell and reduces an estimation error of the SOC of the first battery cell, thereby reducing an error of the SOC of the battery estimated based on the SOC of the first battery cell, ensuring that the available capacity of the battery can be used completely as possible when the SOC of the battery is 0, and improving user satisfaction.

Figure 4:
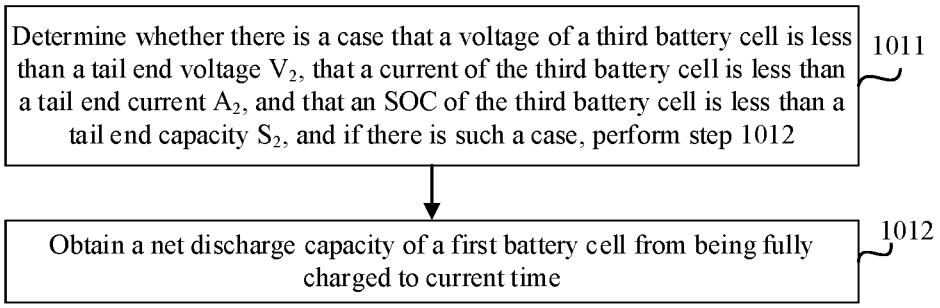
FIG. 4 is a flowchart of step 101 according to an embodiment of this application.

Optionally, as shown in FIG. 4, in some embodiments, step 101 may include the following steps.

Step 1011: Determine whether there is a case that a voltage of a third battery cell is less than a tail end voltage $V_2$, that a current of the third battery cell is less than a tail end current $A_2$, and that a SOC of the third battery cell is less than a tail end capacity $S_2$, and if there is such a case, perform step 1012.

The third battery cell is any one of the first-type battery cell or the second-type battery cell. It can be understood that the third battery cell may be a battery cell the same as or different from the first battery cell or the second battery cell.

Step 1012: Obtain the net discharge capacity of the first battery cell from being fully charged to current time.

In the foregoing solution of this embodiment, $V_2$, $A_2$, and $S_2$ are sequentially a voltage value, a current value, and a capacity value that approach a discharging tail end of the third battery cell, where the discharging tail end refers to a discharging process when the SOC of the third battery cell approaches 0. For example, a discharging process after a capacity of the third battery cell is less than 10% may be defined as the discharging tail end. In this case, $V_2$ represents a voltage when the capacity of the third battery cell is 10%, $A_2$ represents a current when the capacity of the third battery cell is 10%, $S_2$ is 10%, and specific values of $V_2$, $A_2$, and $S_2$ are determined based on the nominal capacity of the battery and usage scenarios. $V_2$, $A_2$ and $S_2$ may be all stored in the BMS.

Whether to obtain the net discharge capacity of the first battery cell from being fully charged to current time is determined based on the tail end voltage $V_2$, the tail end current $A_2$, and the tail end capacity $S_2$, ensuring that instructions in step 1012 and step 102 to step 106 are executed only when the SOC of the third battery cell truly approaches 0, and reducing operation times of the BMS.

Optionally, in some embodiments, in step 103, the current remaining dischargeable capacity of the first battery cell is obtained according to the following equation:

$$C_1 = C_0 \times SOH - (C_0 - C_T) - C_2,$$

where $C_1$ represents the current remaining dischargeable capacity of the first battery cell; $C_0$ represents the nominal capacity of the battery; $C_T$ represents an available capacity of the first battery cell at a current temperature; $C_2$ represents the net discharge capacity of the first battery cell; and SOH represents the current state of health SOH of the first battery cell, ranging from 0% to 100%.

In the foregoing equation, the current remaining dischargeable capacity of the first battery cell is associated with the current temperature and current state of health of the first battery cell, so that the current remaining dischargeable capacity of the first battery cell can be accurately calculated, with a relatively small calculation error and high data accuracy.

It should be noted that, in some embodiments, for calculation of the net discharge capacity of the first battery cell, one discharging process serves as one accumulation cycle, where one discharging process refers to a process between two adjacent full charges of the battery. In one discharging process, the battery may only discharge, or may discharge and charge alternately. Therefore, in this embodiment of this application, the net discharge capacity of the battery at current time=cumulative discharge capacity−cumulative charge capacity, where the cumulative discharge capacity is a total discharge capacity of the first battery core from last being fully charged to current time, and the cumulative charge capacity is a total charge capacity of the first battery cell from the last fully charge state to current time.

The foregoing operation can be performed by the BMS.

Figure 5:
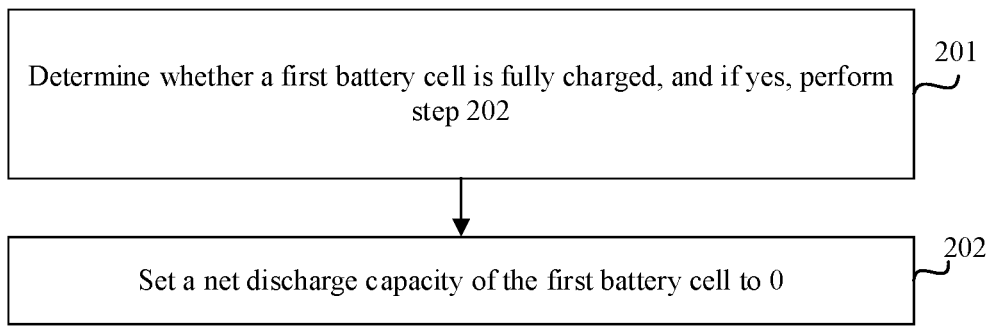
FIG. 5 is a flowchart of a method for setting a net discharge capacity of a first battery cell according to an embodiment of this application.

Optionally, as shown in FIG. 5, the net discharge capacity of the first battery cell is set by using the following method.

Step 201: Determine whether the first battery cell is fully charged, and if the first battery cell is fully charged, perform step 202.

Step 202: Set the net discharge capacity of the first battery cell to 0.

In the solution of the foregoing embodiment of this application, every time the first battery cell reaches full charge, the net discharge capacity of the first battery cell is reset to zero, allowing the BMS to call data easily for calculation of the net discharge capacity.

Optionally, in some embodiments, the state-of-charge cut-off control method further includes: setting an $SOC_{total}$ of the battery based on the SOC of each battery cell in the battery.

The BMS determines the state of charge $SOC_{total}$ of the battery according to the following equation:

$$SOC_{total}=SOC_{min}/(1-SOC_{max}+SOC_{min})\times 100\%,$$

where $SOC_{total}$ represents the state of charge of the battery;

$SOC_{min}$ represents a state of charge of a minimum-power battery cell in the battery; and $SOC_{max}$ represents a state of charge of a maximum-power battery cell in the battery.

The state of charge of each battery cell in the battery estimated by using the state-of-charge cut-off control method in the foregoing embodiment of this application is relatively precise, and therefore the state of charge of the battery estimated based on the state of charge of the battery cell is also relatively precise.

It should be noted that, when the $SOC_{total}$ of the battery is being set, if the SOC of any battery cell in the battery is 0, the $SOC_{total}$ may be set to 0.

Figure 6:
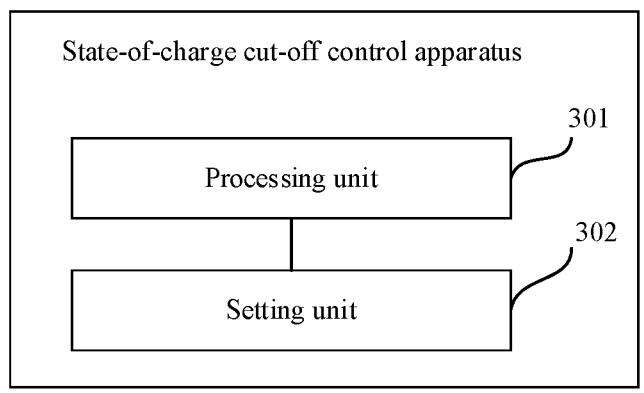
FIG. 6 is a structural diagram of a state-of-charge cut-off control apparatus according to an embodiment of this application.

As shown in FIG. 6, an embodiment of this application further provides a state-of-charge cut-off control apparatus. The apparatus includes units for implementing the state-of-charge cut-off control method and steps in any one of the foregoing embodiments.

For example, the apparatus includes: a processing unit 301 and a setting unit 302, where the processing unit 301 and the setting unit 302 may be directly or indirectly connected by using electrical signals.

The processing unit 301 is configured to obtain a net discharge capacity of a first battery cell from being fully charged to current time, where a battery includes at least a first-type battery cell and a second-type battery cell, the first-type battery cell and the second-type battery cell are battery cells with different capacities, and the first battery cell is any one of the first-type battery cell or the second-type battery cell.

The processing unit 301 is further configured to obtain an available capacity of the first battery cell and a state of health SOH of the first battery cell.

The processing unit 301 is further configured to obtain a current remaining dischargeable capacity of the first battery cell, based on a nominal capacity of the battery, the net discharge capacity of the first battery cell, the available capacity of the first battery cell, and the SOH of the first battery cell.

The setting unit 302 is configured to set a state of charge SOC of the first battery cell to 0 when a sum of the current remaining dischargeable capacity of the first battery cell and the net discharge capacity of the first battery cell is greater than or equal to the nominal capacity of the battery and the net discharge capacity of the first battery cell is equal to the nominal capacity of the battery.

In some embodiments, the setting unit 302 is further configured to set the SOC of the first battery cell to $S_1$ when the sum of the current remaining dischargeable capacity of the first battery cell and the net discharge capacity of the first battery cell is less than the nominal capacity and the state of charge SOC of the first battery cell is less than the cut-off capacity $S_1$, where the $S_1$ is greater than 0.

In some embodiments, the processing unit 301 obtains the current remaining dischargeable capacity of the first battery cell according to the following equation:

$$C_1=C_0\times SOH-(C_0-C_T)-C_2,$$

where $C_1$ represents the current remaining dischargeable capacity of the first battery cell; $C_0$ represents the nominal capacity of the battery; $C_T$ represents an available capacity of the first battery cell at a current temperature; $C_2$ represents the net discharge capacity of the first battery cell; and SOH represents the current state of health of the first battery cell, ranging from 0% to 100%.

In some embodiments, the nominal capacity of the battery is less than or equal to an initial capacity of a second battery cell, where the second battery cell is a battery cell with a minimum initial capacity in the battery.

In some embodiments, the obtaining, by the processing unit 301, the net discharge capacity of the first battery cell from being fully charged to current time includes:

determining, by the processing unit 301, whether there is a case that a voltage of a third battery cell is less than a tail end voltage $V_2$, that a current of the third battery cell is less than a tail end current $A_2$, and that a SOC of the third battery cell is less than a tail end capacity $S_2$, and if there is such a case, obtaining the net discharge capacity of the first battery cell from being fully charged to current time, where the third battery cell is any one of the first-type battery cell or the second-type battery cell.

In some embodiments, the processing unit 301 determines a state of charge $SOC_{total}$ of the battery according to the following equation:

$$SOC_{total}=SOC_{min}/(1-SOC_{max}+SOC_{min})\times 100\%,$$

where $SOC_{total}$ represents the state of charge of the battery; $SOC_{min}$ represents a state of charge of a minimum-power battery cell in the battery; and $SOC_{max}$ represents a state of charge of a maximum-power battery cell in the battery.

The state-of-charge cut-off control apparatus according to this embodiment of this application determines, by using the processing unit and the setting unit, any first battery cell in the battery with two types of battery cells, and sets the state of charge SOC of the first battery cell to 0 when the sum of the current remaining dischargeable capacity of the first battery cell and the net discharge capacity of the first battery cell is greater than or equal to the nominal capacity of the battery and the net discharge capacity of the first battery cell is equal to the nominal capacity of the battery, so that when the first battery cell releases the nominal capacity, the SOC of the first battery cell is displayed as 0. In this case, the remaining dischargeable capacity of the first battery cell is greater than or equal to 0. The SOC of the battery is obtained based on the SOC of the first battery cell. Therefore, when the SOC of the battery is 0, the remaining dischargeable capacity of the battery is greater than or equal to 0, reducing a probability that an electric apparatus shuts down halfway before the displayed SOC of the battery becomes 0.

For the apparatus in the foregoing embodiment, a specific manner in which the units implement operations has been described in the embodiments of the state-of-charge cut-off control method in detail. Details are not described herein.

It should be understood that, units in the foregoing apparatus are partitioned merely based on logic functions. In an actual implementation, the units may be all or partly integrated on a physical entity, and may alternatively be separated physically. In addition, the units in the apparatus may be all implemented in a form of software called by a processing component, or may be all implemented in a form of hardware; or some of the units may be implemented in a form of software called by a processing component, and some of the units may be implemented in a form of hardware. For example, each unit may be a separate processing component, or may be integrated in a chip of the apparatus. In addition, each unit may be stored in a memory in a form of a program and called by a processing component of the apparatus to implement functions of the unit. In addition, these units may be all or partly integrated, or may be implemented separately. The processing component herein may be an integrated circuit, and has a signal processing capability. In an implementation process, all the steps of the foregoing method or all the foregoing units may be implemented through an integrated logic circuit of hardware in the processing component, or may be implemented in a form of software called by the processing component.

Figure 7:
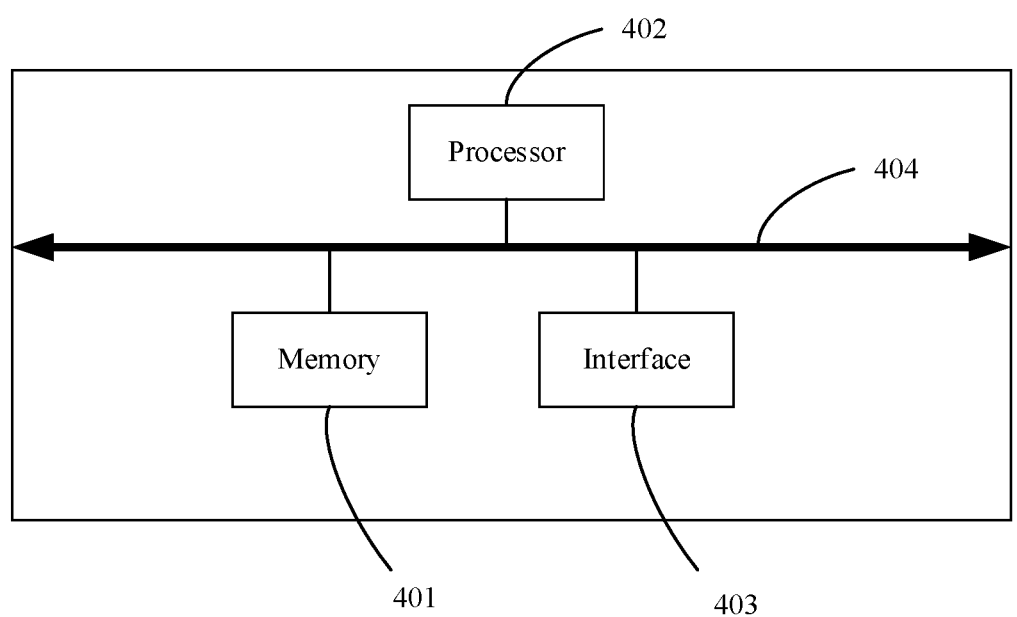
FIG. 7 is a structural diagram of a state-of-charge cut-off control system according to an embodiment of this application.

Referring to FIG. 7, an embodiment of this application further provides a state-of-charge cut-off control system. The system includes: a memory 401, a processor 402, and an interface 403. The memory 401, the processor 402, and the interface 403 are connected through a bus 404. The bus 404 may be implemented through a connecting circuit. The memory 401 is configured to store a program. When the program is called by the processor 402, the method executed by the state-of-charge cut-off control apparatus according to the foregoing embodiment may be implemented. The interface 403 is configured to communicate with a charging apparatus or other external systems. The interface 403 may communicate with the charging apparatus or other external systems in a wired connection manner or a wireless connection manner.

Functions of the units of the foregoing state-of-charge cut-off control apparatus may be implemented by calling the program stored in the memory 401 by the processor 402. That is, the foregoing state-of-charge cut-off control apparatus includes a processor 402 and a memory 401. The memory 401 is configured to store a program. When the program is called by the processor 402, the method according to the foregoing method embodiment is implemented. The processor 402 herein may be a general-purpose processor, or may be other processors capable of calling a program. Alternatively, the processor 402 may be configured as one or more integrated circuits to implement the method executed by the state-of-charge cut-off control apparatus according to the foregoing embodiment, for example, one or more application specific integrated circuits (ASIC), one or more digital signal processors (DSP), one or more field programmable gate arrays (FPGA), other programmable logic devices, discrete gate or transistor logic devices, discrete hardware components, or the like. For another example, when units in the state-of-charge cut-off control apparatus may be implemented in a form of a program called by the processor 402, the processor 402 may be a general-purpose processor, for example, a central processing unit (CPU), a controller, a microcontroller, a single-chip microcomputer, or another processor capable of calling a program. For another example, these units may be integrated in a form of a system-on-chip (SOC) for implementation.

The number of the memories 401 is not limited, and may be one or more.

The memory 401 includes at least one type of readable storage medium. The readable storage medium includes a non-volatile memory or a volatile memory, for example, a flash memory, a hard disk, a multimedia card, a disk memory (for example, an SD or DX memory), a random access memory (RAM), a read-only memory (ROM), an erasable programmable read-only memory (EPROM), an electrically erasable programmable read-only memory (EEPROM), a programmable read-only memory (PROM), a magnetic memory, a magnetic disk, a compact disc, or the like. The RAM may include a static RAM or a dynamic RAM. In some embodiments, the memory 401 may be an internal memory of the apparatus, for example, a hard disk or a memory of the apparatus. In some other embodiments, the memory 401 may be an external storage device of the apparatus, for example, a plug-in hard disk, a smart media card (SMC), a secure digital (SD) card, a flash card (FC), or the like that is provided on the apparatus. Certainly, the memory 401 may further include both the internal memory of the apparatus and the external storage device of the apparatus. In this embodiment, the memory 401 is generally configured to store an operating system and various application software that are installed in the apparatus, for example, program code for the state-of-charge cut-off control method. In addition, the memory 401 may further be configured to temporarily store various data that has been output or that is to be output.

The bus 404 may be an industry standard architecture (ISA) bus, a peripheral component interconnect (PCI) bus, an extended industry standard architecture (EISA) bus, or the like. The bus 404 may include an address bus, a data bus, a control bus, or the like. For ease of illustration, the bus is only represented by one bold line in the figures, but it is not indicated that there is only one bus or one type of bus.

Generally, the processor 402 is configured to control overall operations of the system. In this embodiment, the memory 401 is configured to store program code or instructions. The program code includes computer operation instructions. The processor 402 is configured to execute the program code or instructions stored in the memory 401, or process data, for example, run the program code for the state-of-charge cut-off control method.

Finally, an embodiment of this application further provides a computer-readable storage medium, where the computer-readable storage medium stores a computer program, and when the computer program runs on a computer, the computer executes the state-of-charge cut-off control method according to the foregoing embodiments. The computer-readable storage medium has been described in detail in the foregoing embodiment of the state-of-charge cut-off control system. Details are not described herein.

To sum up, in the embodiments of this application, any first battery cell in the battery with two types of battery cells is determined, and the state of charge SOC of the first battery cell is set to 0 when the sum of the current remaining dischargeable capacity of the first battery cell and the net discharge capacity of the first battery cell is greater than or equal to the nominal capacity of the battery and the net discharge capacity of the first battery cell is equal to the nominal capacity of the battery, so that when the first battery cell releases the nominal capacity, the SOC of the first battery cell is displayed as 0. In this case, the remaining dischargeable capacity of the first battery cell is greater than or equal to 0. The SOC of the battery is obtained based on the SOC of the first battery cell. Therefore, when the SOC of the battery is 0, the remaining dischargeable capacity of the battery is greater than or equal to 0, reducing a probability that an electric apparatus shuts down halfway before the displayed SOC of the battery becomes 0.

Persons skilled in the art can understand that, combinations of features of different embodiments are meant to be within the scope of this application and to form different embodiments. For example, in the claims, any one of the claimed embodiments may be used in any combination.

In conclusion, it should be noted that the foregoing embodiments are merely intended for describing the technical solutions of this application, but not for limiting this application. Although this application is described in detail with reference to the foregoing embodiments, persons of ordinary skills in the art should understand that they may still make modifications to the technical solutions described in the foregoing embodiments or make equivalent replacements to some technical features thereof, without departing from the spirit and scope of the technical solutions of the embodiments of this application.

What is claimed is:

1. A state-of-charge cut-off control method, comprising:
obtaining, in a discharging process of a battery, a net discharge capacity of a first battery cell from being fully charged to current time, wherein the battery comprises at least a first-type battery cell and a second-type battery cell, the first-type battery cell and the second-type battery cell are battery cells with different positive electrode materials, and the first battery cell is any one of the first-type battery cell or the second-type battery cell;
obtaining an available capacity of the first battery cell and a state of health (SOH) of the first battery cell;
obtaining a current remaining dischargeable capacity of the first battery cell, based on a nominal capacity of the battery, the net discharge capacity of the first battery cell, the available capacity of the first battery cell, and the SOH of the first battery cell;
wherein the current remaining dischargeable capacity of the first battery cell is obtained according to the following equation:

$$C_1 = C_0 \times SOH - (C_0 - C_T) - C_2,$$

wherein $C_1$ represents the current remaining dischargeable capacity of the first battery cell;
$C_0$ represents the nominal capacity of the battery;
$C_T$ represents an available capacity of the first battery cell at a current temperature;
$C_2$ represents the net discharge capacity of the first battery cell; and
SOH represents the current SOH of the first battery cell, ranging from 0% to 100%; and
when a sum of the current remaining dischargeable capacity of the first battery cell and the net discharge capacity of the first battery cell is greater than or equal to the nominal capacity of the battery, displaying a state of charge (SOC) of the first battery cell to 0 when the net discharge capacity of the first battery cell is equal to the nominal capacity of the battery;
wherein the method further comprises:
setting the SOC of the first battery cell to a cut-off capacity $S_1$ when the sum of the current remaining dischargeable capacity of the first battery cell and the net discharge capacity of the first battery cell is less than the nominal capacity and the SOC of the first battery cell is less than the cut-off capacity $S_1$, wherein the $S_1$ is greater than 0.

2. The method according to claim 1, further comprising:
setting the SOC of the first battery cell to 0 when the sum of the current remaining dischargeable capacity of the first battery cell and the net discharge capacity of the first battery cell is less than the nominal capacity, a voltage of the first battery cell is less than a cut-off voltage $V_1$, and a current of the first battery cell is less than a cut-off current $A_1$.

3. The method according to claim 1, wherein the nominal capacity of the battery is less than or equal to an initial available capacity of a second battery cell, wherein the second battery cell is a battery cell with a minimum initial available capacity in the battery.

4. The method according to claim 1, wherein the obtaining a net discharge capacity of a first battery cell from being fully charged to current time further comprises:
determining whether there is a case that a voltage of a third battery cell is less than a tail end voltage $V_2$, that a current of the third battery cell is less than a tail end current $A_2$, and that a SOC of the third battery cell is less than a tail end capacity $S_2$, and if there is such a case, obtaining the net discharge capacity of the first battery cell from being fully charged to current time, wherein the third battery cell is any one of the first-type battery cell or the second-type battery cell.

5. The method according to claim 1, further comprising:
determining a state of charge $SOC_{total}$ of the battery according to the following equation:

$$SOC_{total} = SOC_{min}/(1 - SOC_{max} + SOC_{min}) \times 100\%,$$

wherein $SOC_{total}$ represents the state of charge of the battery;
$SOC_{min}$ represents a state of charge of a minimum-power battery cell in the battery; and
$SOC_{max}$ represents a state of charge of a maximum-power battery cell in the battery.

6. A state-of-charge cut-off control system, comprising:
a processor, a memory, and a bus, wherein the memory and the processor communicate with each other through the bus;
the memory is configured to store executable program code; and
the processor is configured to read the executable program code stored in the memory, to execute the state-of-charge cut-off control method according to claim 1.

7. A non-transitory computer-readable storage medium storing a computer program, and when the computer program runs on a computer, the computer executes the state-of-charge cut-off method according to claim 1.

8. A state-of-charge cut-off control apparatus, comprising:
a processing unit, configured to:
obtain a net discharge capacity of a first battery cell from being fully charged to current time, wherein a battery comprises at least a first-type battery cell and a second-type battery cell, the first-type battery cell and the second-type battery cell are battery cells with different capacities, and the first battery cell is any one of the first-type battery cell or the second-type battery cell;
obtain an available capacity of the first battery cell, which may be greater than a nominal capacity, and a state of health (SOH) of the first battery cell; and
obtain a current remaining dischargeable capacity of the first battery cell, based on a nominal capacity of the battery, the net discharge capacity of the first battery cell, the available capacity of the first battery cell, and the SOH of the first battery cell;
wherein the current remaining dischargeable capacity of the first battery cell is obtained according to the following equation:

$$C_1 = C_0 \times SOH - (C_0 - C_T) - C_2,$$

wherein $C_1$ represents the current remaining dischargeable capacity of the first battery cell;

$C_0$ represents the nominal capacity of the battery;

$C_T$ represents an available capacity of the first battery cell at a current temperature;

$C_2$ represents the net discharge capacity of the first battery cell; and

SOH represents the current SOH of the first battery cell, ranging from 0% to 100%; and a setting unit, configured to:

when a sum of the current remaining dischargeable capacity of the first battery cell and the net discharge capacity of the first battery cell is greater than or equal to the nominal capacity of the battery, display a state of charge (SOC) of the first battery cell to 0 when the net discharge capacity of the first battery cell is equal to the nominal capacity of the battery; and set the SOC of the first battery cell to a cut-off capacity $S_1$ when the sum of the current remaining dischargeable capacity of the first battery cell and the net discharge capacity of the first battery cell is less than the nominal capacity and the state of charge SOC of the first battery cell is less than the cut-off capacity $S_1$, wherein $S_1$ is greater than 0.

9. The state-of-charge cut-off control apparatus according to claim 8, wherein the setting unit is further configured to:

set the state of charge SOC of the first battery cell to 0 when the sum of the current remaining dischargeable capacity of the first battery cell and the net discharge capacity of the first battery cell is less than the nominal capacity, a voltage of the first battery cell is less than a cut-off voltage $V_1$, and a current of the first battery cell is less than a cut-off current $A_1$.

10. The state-of-charge cut-off control apparatus according to claim 8, wherein the nominal capacity of the battery is less than or equal to an initial available capacity of a second battery cell, wherein the second battery cell is a battery cell with a minimum initial available capacity in the battery.

11. The state-of-charge cut-off control apparatus according to claim 8, wherein the obtaining, by the processing unit, a net discharge capacity of a first battery cell from being fully charged to current time comprises:

determining, by the processing unit, whether there is a case that a voltage of a third battery cell is less than a tail end voltage $V_2$, that a current of the third battery cell is less than a tail end current $A_2$, and that a SOC of the third battery cell is less than a tail end capacity $S_2$, and if there is such a case, obtaining the net discharge capacity of the first battery cell from being fully charged to current time, wherein the third battery cell is any one of the first-type battery cell or the second-type battery cell.

12. The state-of-charge cut-off control apparatus according to claim 8, wherein the processing unit is further configured to:

determine a state of charge $SOC_{total}$ of the battery according to the following equation:

$SOC_{total} = SOC_{min}/(1-SOC_{max}+SOC_{min}) \times 100\%$, wherein $SOC_{total}$ represents the state of charge of the battery;

$SOC_{min}$ represents a state of charge of a minimum-power battery cell in the battery; and $SOC_{max}$ represents a state of charge of a maximum-power battery cell in the battery.

\* \* \* \* \*